United States Patent
Sugawara et al.

(10) Patent No.: US 6,841,430 B2
(45) Date of Patent: Jan. 11, 2005

(54) SEMICONDUCTOR AND FABRICATION METHOD THEREOF

(75) Inventors: Minoru Sugawara, Kanagawa (JP); Takashi Noguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/818,820

(22) Filed: Apr. 6, 2004

(65) Prior Publication Data

US 2004/0188723 A1 Sep. 30, 2004

Related U.S. Application Data

(62) Division of application No. 09/733,474, filed on Dec. 8, 2000, now Pat. No. 6,750,486.

(30) Foreign Application Priority Data

May 27, 1998 (JP) .......................................... P10-145533

(51) Int. Cl.⁷ ............................................. H01L 21/00
(52) U.S. Cl. ....................... 438/153; 438/154; 438/223; 438/224; 438/227; 438/228; 257/265; 257/351; 257/371

(58) Field of Search .................................. 438/223, 224, 438/227, 228, 153, 154; 257/265, 351, 371

(56) References Cited

U.S. PATENT DOCUMENTS 5,847,419 A * 12/1998 Imai et al. ................... 257/192
6,190,975 B1 * 2/2001 Kubo et al. ................. 438/285

* cited by examiner

*Primary Examiner*—David Nelms
*Assistant Examiner*—Andy Huynh
(74) *Attorney, Agent, or Firm*—Sonnenschein, Nath & Rosenthal LLP

(57) ABSTRACT

A semiconductor device with p-channel and n-channel field effect devices formed on a common substrate, where the drain and source regions of the n-channel field effect device are formed within a silicon epitaxial layer formed on a silicon layer germanium relax which is formed on a silicon germanium buffer layer with a graduated germanium concentration. Additionally, drain and source regions of the p-channel field effect device are formed within a silicon-germanium compound layer formed on the substrate and the silicon epitaxial cap layer formed on the silicon-germanium compound layer.

1 Claim, 6 Drawing Sheets

SEMICONDUCTOR AND FABRICATION METHOD THEREOF

RELATED APPLICATION DATA

The present application is a divisional of U.S. application Ser. No. 09/733,474, filed Dec. 8, 2000, now U.S. Pat. No. 6,750,486 which is incorporated herein by reference to the extent permitted by law.

BACKGROUND OF THE INVENTION

The present invention relates to a semiconductor device and a fabrication method thereof, and particularly to a semiconductor device in which an n-channel field effect transistor and a p-channel field effect transistor are provided on a common base-substrate, and a fabrication method thereof.

In recent years, along with rapid advance in digitization of information processing means, there have been strong demands to increase the operational speeds of semiconductor devices and to reduce the power consumption of semiconductor devices. Conventionally, the increase in operational speed of semiconductor devices has been achieved by making finer device structures, and the reduction in power consumption thereof has been achieved by adopting semiconductor devices of a complementary type including n-channel and p-channel field effect transistors. The technique for making finer device structures, however, has already reached a limitation of a lithography process, in which a pattern having a size smaller than a wavelength of exposure light has been needed to be formed by lithography, and accordingly, at the lithography step, it has come to be difficult to ensure a sufficient process tolerance. In other words, the attempt to increase the operational speeds of semiconductor devices by making finer device structures is coming closer to a limitation.

For field effect transistors, there has been proposed an attempt to solve the above problem by imparting a strain effect to a channel layer. The formation of devices using a material layer having such a strain effect has become possible by an advanced thin film formation technology using a group IV element containing semiconductor material such as silicon or a silicon-germanium compound, and at present, improved low voltage devices have been actively developed by using material layers having the strain effect.

The strain effect means a phenomenon that if stress is applied to a semiconductor thin film, the energy band of the semiconductor is strained, to thereby change the effective masses of carriers in the semiconductor. The formation of a semiconductor thin film having the strain effect has become possible by controlling an internal stress applied to a multilayer film typically containing a silicon layer and a silicon-germanium compound layer by a molecular beam epitaxy process or an ultrahigh vacuum chemical vapor deposition process (UHV-CVD). High performance MOS based devices, sensors, and the like of a type in which a difference in band gap and film strain are controlled by hetero-junction have been also developed.

A silicon based MOS (Metal-Oxide-Semiconductor) including layers each having a strain effect can be produced by sequentially stacking a buffer layer made from a silicon-germanium compound having a germanium concentration gradually increased toward an upper surface of the buffer layer, a relax layer made from a silicon-germanium compound, and a silicon layer on a silicon substrate in this order. In this MOS transistor, since tensile stress is generated in the silicon layer, a strain effect due to the tensile stress appears, with a result that the mobility of electrons is increased by the strain effect in the silicon layer; and since compressive stress is generated in the silicon-germanium compound layer formed on the silicon substrate, a strain effect due to the compressive stress appears, with a result that the mobility of positive holes is increased by the strain effect in the silicon-germanium compound layer.

A field effect transistor produced by controlling stress in a channel layer by making use of the above-described strain effect exhibits a high mutual conductance [gm (mobility)]. A pMOS transistor produced by making use of the strain effect has been disclosed in Appl. Phys. Letter (USA), 63(1993) S. P. Voinigensen et al., p660, and IEEE Electronic Devices (USA), 43(1996), L. H. Jiang and R. G. Elliman, p97. Further, an nMOS transistor produced by making use of the strain effect has been disclosed in Appl. Phys. Letter (USA), 64(1994) K. Ismail et al., p3124 and IEDM 94-37 (USA), (1994) J. Welser et al.

The semiconductor devices produced by making use of the strain effect have the following problem:

In a silicon layer formed on a relax layer, the mobility of electrons is increased by the strain effect due to tensile stress; however, the mobility of positive holes is reduced. Accordingly, while an nMOS transistor having an improved low voltage can be obtained, the performance of a pMOS transistor cannot be improved, with a result that the performance of the CMOS cannot be significantly improved.

On the other hand, in a silicon-germanium compound layer formed on a silicon substrate, the mobility of positive holes is improved by the strain effect due to compressive stress; however, the mobility of electrons is reduced. Accordingly, while a pMOS transistor having an improved low voltage can be obtained, the performance of an nMOS transistor cannot be improved, with a result that the performance of the CMOS cannot be significantly improved.

As described above, according to the related art method, it has been impossible to obtain a high performance CMOS and hence to produce a semiconductor device having a high performance and a low power consumption.

SUMMARY OF THE INVENTION

An object of the present invention is to provide a semiconductor device capable of increasing the operational speed and reducing the power consumption by providing an nMOS in which the mobility of electrons is increased by a strain effect and a pMOS in which the mobility of positive holes is increased by the strain effect on a common base-substrate, and to provide a method of fabricating the semiconductor device by using the same fabrication process as that used for fabricating a related art CMOS in which the base-substrate is configured as only a silicon substrate.

To achieve the above object, according to a first aspect of the present invention, there is provided a semiconductor device including an n-channel field effect transistor and a p-channel field effect transistor, the both transistors being provided on a common base-substrate, wherein a surface region, in which the n-channel field effect transistor is provided, of the base-substrate includes: a silicon substrate; a buffer layer formed on the silicon substrate, the buffer layer being made from a silicon-germanium compound having a germanium concentration gradually increased toward an upper surface of the buffer layer; a relax layer formed on the buffer layer, the relax layer being made from a silicon-germanium compound having a germanium concentration nearly equal to that of a surface portion of the buffer layer; and a silicon layer formed on the relax layer, and wherein a surface region, on which the p-channel field effect transistor is provided, of the base-substrate, includes: the silicon substrate; a silicon-germanium compound layer formed on the silicon substrate; and a cap layer formed on the silicon-germanium compound layer, the cap layer being made from silicon. In the above-mentioned semiconductor device, source/drain regions of the n-channel field effect transistor may be formed in the silicon layer, and the regions of the p-channel field effect transistor may be formed in the silicon-germanium compound layer.

With this configuration, since the semiconductor device has the CMOS configuration in which the n-channel field effect transistor and the p-channel field effect transistor are provided on the common base-substrate, the power consumption can be reduced. Further, in the n-channel field effect transistor, since the silicon layer is provided on the relax layer made from the silicon-germanium compound whose stress is relaxed because it is formed on the buffer layer, tensile stress is generated in the silicon layer, so that the mobility of electrons is increased by the strain effect due to tensile stress in the silicon layer; and in the p-channel field effect transistor, since the silicon-germanium compound layer is provided on the silicon substrate, compressive stress is generated in the silicon-germanium compound layer, so that the mobility of positive holes is increased due to the strain effect due to the compressive stress in the silicon-germanium compound layer. According to the semiconductor device of the present invention, since the source/drain regions are formed in each of the silicon layer and silicon-germanium compound layer having the above-described unique properties, the operational speeds of the n-channel field effect transistor and p-channel field transistor can be improved.

According to a second aspect of the present invention, there is provided a method of fabricating a semiconductor device in which an n-channel field effect transistor and a p-channel field effect transistor are provided on a common base-substrate, the method including the steps of: etching a surface layer of an n-channel region, in which the n-channel field effect transistor is to be formed, of a silicon substrate, to form a stepped recess at the n-type region; forming a buffer layer made from a silicon-germanium compound having a germanium concentration gradually increased toward an upper surface of the buffer layer on the silicon substrate; forming a relax layer made from a silicon-germanium compound having a germanium concentration nearly equal to that of a surface portion of the buffer layer on the buffer layer; forming a silicon layer on the relax layer; removing the silicon layer, the relax layer, and the buffer layer in a p-type region, on which a p-channel field effect transistor is to be formed, of the silicon substrate, by etching using a resist pattern as a mask; forming a silicon-germanium compound layer on both the silicon substrate and the silicon layer; planarizing the surface of the silicon-germanium compound layer in a state that the silicon layer is exposed in the n-type region and the silicon-germanium compound layer is left in the p-type region; forming a silicon epitaxial layer on both the silicon layer and the silicon-germanium compound layer, to form a silicon layer composed of the silicon layer and the silicon epitaxial layer in the n-type region, and to form a cap layer composed of the silicon epitaxial layer in the p-type region; and forming gate electrodes on the silicon layer in the n-type region and on the cap layer in the p-type region via a gate insulating film, and forming n-type source/drain regions in the silicon layer and p-type source/drain regions in the silicon-germanium compound layer.

With this configuration, the n-channel field effect transistor, in which the silicon layer is formed on the silicon substrate via the buffer layer and relax layer and the source/drain regions are formed in the silicon layer, is provided in the n-type region; and a p-channel field effect transistor, in which a silicon-germanium compound layer is formed on the silicon substrate and the source/drain regions are formed in the silicon-germanium compound layer, is provided in the p-type region. In this case, the silicon-germanium layer is formed in the state that the buffer layer, relax layer, and silicon layer are left in the stepped recess formed at the n-type region of the silicon substrate, and the surface of the silicon-germanium compound layer is planarized by a CMP process in such a manner as to expose the silicon layer only in the n-type region, and accordingly, the gate electrodes of the n-channel field effect transistor and p-channel field effect transistor are formed on a planar base-substrate. As a result, the planar structure of the semiconductor device of the present invention becomes similar to that of a related art semiconductor device in which the base-substrate is configured as only a silicon substrate.

DETAILED DESCRIPTION OF THE PREFERRED EMBODIMENT

Hereinafter, an embodiment of the present invention will be described with reference to the drawings.

Figure 1:
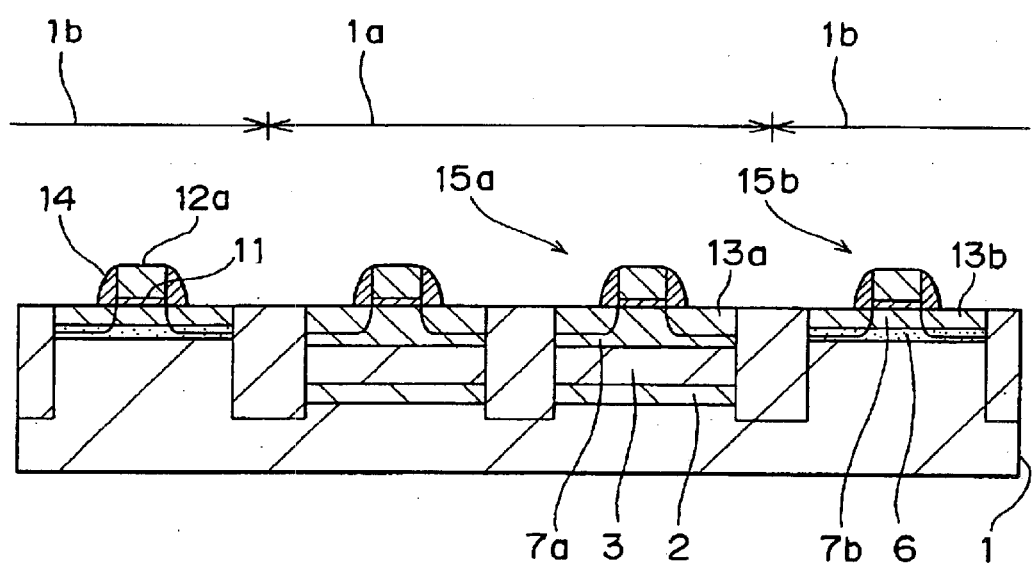
FIG. 1 is a sectional view of a semiconductor device according to the present invention.

FIG. 1 is a sectional view of a semiconductor device to which the present invention is applied. The semiconductor device has a CMOS configuration in which an n-channel field effect transistor (nMOSTr) 15a and a p-channel field effect transistor (pMOSTr) 15b are provided on a common base-substrate. FIGS. 2A to 6C are sectional views of fragmental structures of the semiconductor device shown in FIG. 1, for illustrating a method of fabricating the semiconductor device.

Figure 2A:
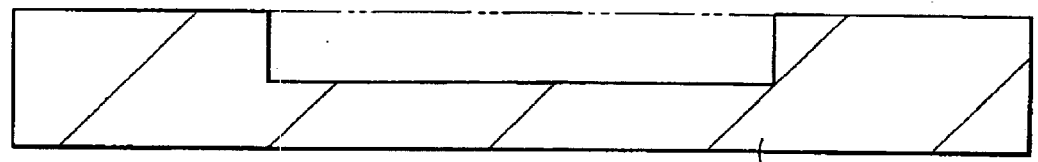
FIGS. 2A to 2D are sectional views of fragmental structures of the semiconductor device shown in FIG. 1, for illustrating steps of fabricating the semiconductor device.

Referring first to FIG. 2A, a p-type silicon substrate 1 having a diameter of 200 mm, produced by a Czochralski process, is prepared. A resist pattern (not shown) having a thickness of 2.0 $\mu$m is formed on the silicon substrate 1 by a lithography process. The resist pattern has an opening portion corresponding to an n-type region 1a on which an nMOSTr is to be formed, and a mask portion corresponding to a p-type region 1b on which a pMOSTr is to be formed. The silicon substrate 1 is etched by using the resist pattern as a mask, to form a stepped recess having a depth of about 2.3 $\mu$m at the n-type region 1a. The etching is performed in high density plasma containing a fluorine based gas such as methane tetrafluoride ($CF_4$). The resist pattern is removed after etching.

Figure 2B:
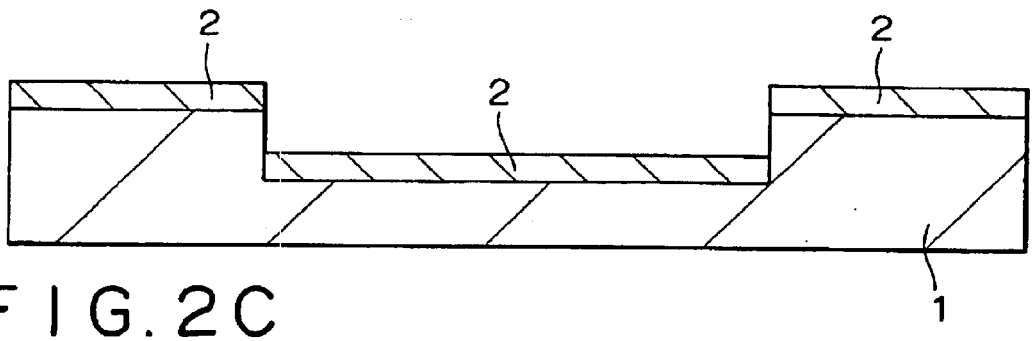

Referring to FIG. 2B, a buffer layer 2 having a thickness of about 1.68 $\mu$m, which is made from a silicon-germanium compound ($Si_{1-x}Ge_x$) having a germanium (Ge) concentration changed in the thickness direction, is formed on the silicon substrate 1. The composition ratio x is changed in a range of 0 to 0.3 in the thickness direction from the silicon substrate 1 side to the upper surface of the buffer layer 2. However, the upper limit of the composition ratio x of germanium, that is, the composition ratio x at the uppermost portion of the buffer layer 2 may exceed 0.3, and preferably less than 0.5.

The buffer layer 2 is formed on the silicon substrate 1 by an ultrahigh vacuum chemical vapor deposition (UHV-CVD) process using a CVD system typically including a load lock chamber, a reaction chamber composed of a quartz tube, and an unload lock chamber. To be more specific, a quartz boat on which 20 pieces of upright silicon substrates 1 are placed is set in the reaction chamber, and the buffer layer 2 is formed on the silicon substrates 1. At this time, the substrate temperature is set in a range of 600 to 900° C., and a silane gas ($SiH_4$) and a germane gas ($GeH_4$) are made to flow in the reaction chamber in a state that hydrogen gas ($H_2$) or argon gas (Ar) has flown in the reaction chamber as a carrier gas. At the initial stage of film formation, only the carrier gas and the silane gas is made to flow, to deposit crystals of Si to a thickness of about 0.1 to 0.3 $\mu$m, thereby moderating the surface roughness of the silicon substrate 1 caused by etching. Subsequently, the germane gas is made to flow in the reaction chamber while adjusting the flow rate in accordance with a specific composition ratio of germanium. In this case, the flow rates of the silane gas and germane gas are adjusted by alternately introducing the silane gas and germane gas at time intervals of a value typically ranging from several hundreds msec to several sec. This facilitates the adjustment of the flow rates of the silane gas and germane gas and improves the crystallinity of the buffer layer 2. The above value of time intervals is suitably selected depending on a conductance of each of the reaction chamber and evacuation system and a gas residence time, and the flow rates of the silane gas and germane gas are adjusted by a computer-controlled highly responsive mass flow controller. Additionally, a single-wafer type CVD system may be used for formation of the buffer layer 2.

It is checked on off-line whether or not the buffer layer 2 thus formed has the specific composition, by analysis such as X-ray diffraction, Rutherford back-scattering (RBS), secondary ion mass spectrometry (SIMS), observation by transmission electron microscope (TEM), spectroscopic ellipsometry, or surface reflection.

Figure 2C:
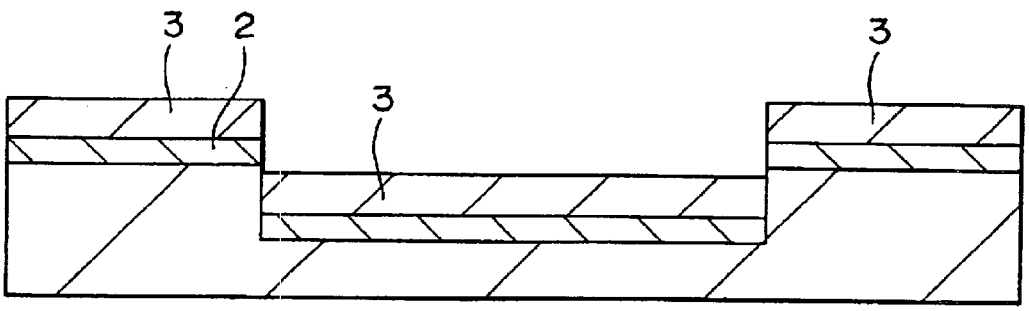

Referring to FIG. 2C, a relax layer 3 having a thickness of about 0.6 $\mu$m, which is made from a silicon-germanium compound ($Si_{1-y}Ge_y$), is formed on the buffer layer 2. The composition ratio y of germanium in the relax layer 3 is set at a value nearly equal to the composition ratio x of germanium at the uppermost portion of the buffer layer 2. The relax layer 3 functions as a stress-relaxed layer.

Following the formation of the buffer layer 2, the relax layer 3 is formed in the above-described reaction chamber. Like the formation of the buffer layer 2, the silane gas and germane gas are alternatively introduced at time intervals of a value typically ranging from several hundreds msec to several sec.

Figure 2D:
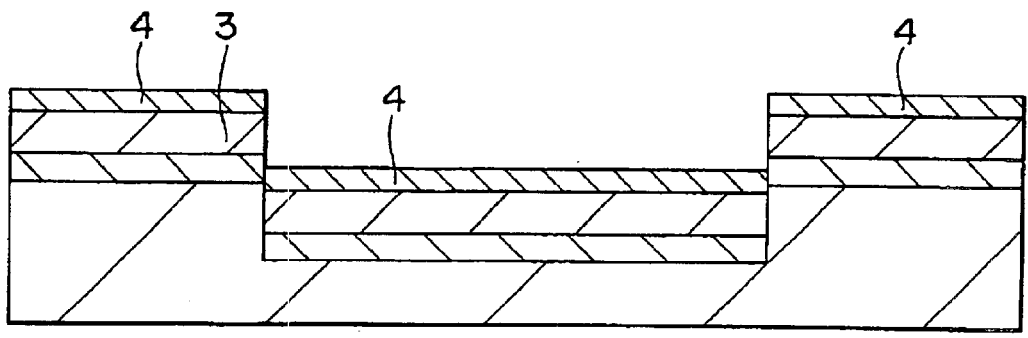

Referring to FIG. 2D, the substrate temperature is cooled to 600° C. in a state that a slight amount of the carrier gas is made to flow in the reaction chamber. In this case, to prevent occurrence of thermal stress due to rapid temperature drop, the substrate temperature is dropped at a rate of about −2° C./min. After the substrate temperature is dropped to 600° C., the silane gas is made to flow in addition to the carrier gas, to form a silicon layer 4 on the relax layer 3 by epitaxial growth. At this formation step, tensile stress is generated in the silicon layer 4. Accordingly, the silicon layer 4 functions as a layer having a strain effect due to the tensile stress generated in the layer. The silicon layer 4 also functions to protect the relax layer 3 from an external environment.

In addition, the thickness of the silicon layer 4 is set such that the surface of the n-type region 1a of the silicon layer is about 50–100 nm higher than the surface of the silicon substrate 1 in the p-type region.

Figure 3A:
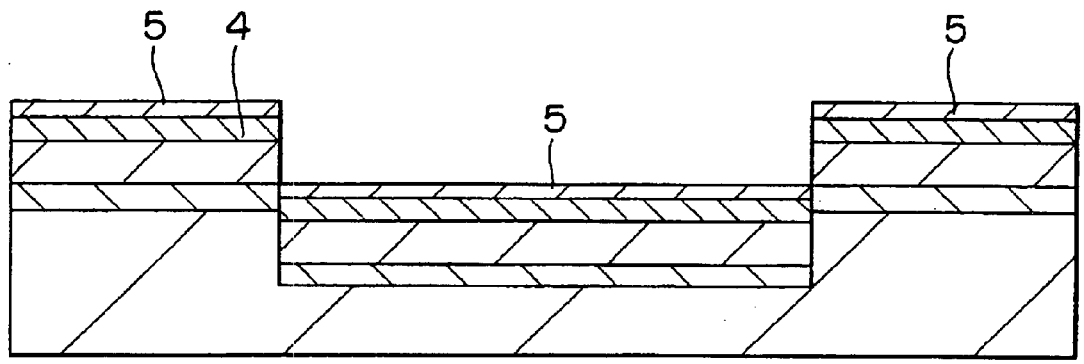
FIGS. 3A to 3C are views similar to FIGS. 2A to 2D showing the steps, continued from those shown in FIGS. 2A to 2D, of fabricating the semiconductor device.

Referring to FIG. 3A, a sacrifice oxide film 5 is formed on the silicon layer 4 by a thermal oxidation process or a CVD process. In this case, to suppress deterioration of the crystal state of each layer made from the silicon-germanium compound formed at the previous steps, the film formation temperature is set at a value of 850° C. or less. In the case of forming the sacrifice oxide film 5 by rapid thermal anneal (RTA) or laser anneal, however, the film formation may be performed under a condition that the heating temperature at a limited region is suppressed at a value less than 937° C. which is a melting point of germanium.

Figure 3B:
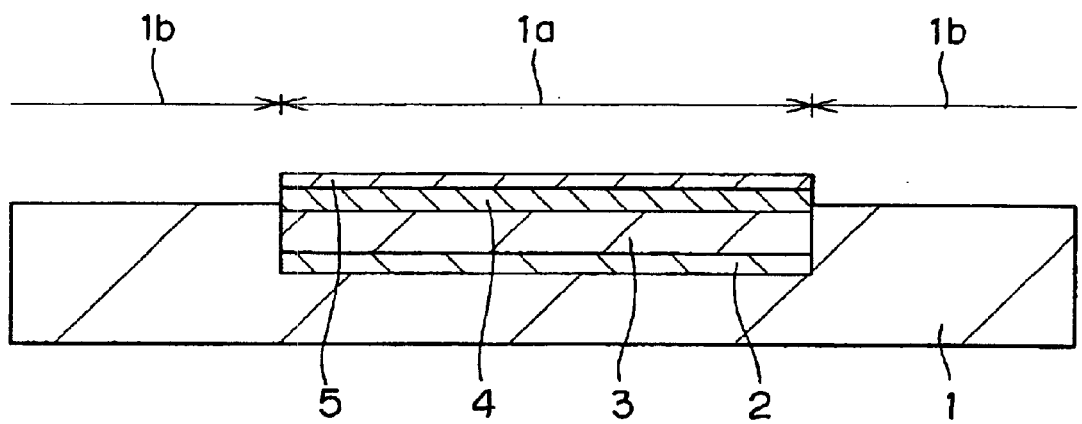

Referring to FIG. 3B, the sacrifice oxide film 5, silicon layer 4, relax layer 3, and buffer layer 2 in the p-type region 1b are removed by etching using a resist pattern (not shown) having a thickness of about 2.3 $\mu$m as a mask, to expose the silicon substrate 1 in the p-type region 1b. The resist pattern has an opening portion corresponding to the p-type region 1b and a mask portion corresponding to the n-type region 1a. The etching is performed in high density plasma containing a fluorine based gas such as methane tetrafluoride ($CF_4$). The resist pattern is removed after etching.

The silicon substrate 1 is overall subjected to chemical mechanical polishing (CMP), to remove damages, caused by etching, on the surface layer of the silicon substrate 1. At this CMP step, only the surface layer of the silicon substrate 1 in the p-type region 1b is polished because the sacrifice oxide film 5 functions as a mask for the n-type region 1a.

Figure 3C:
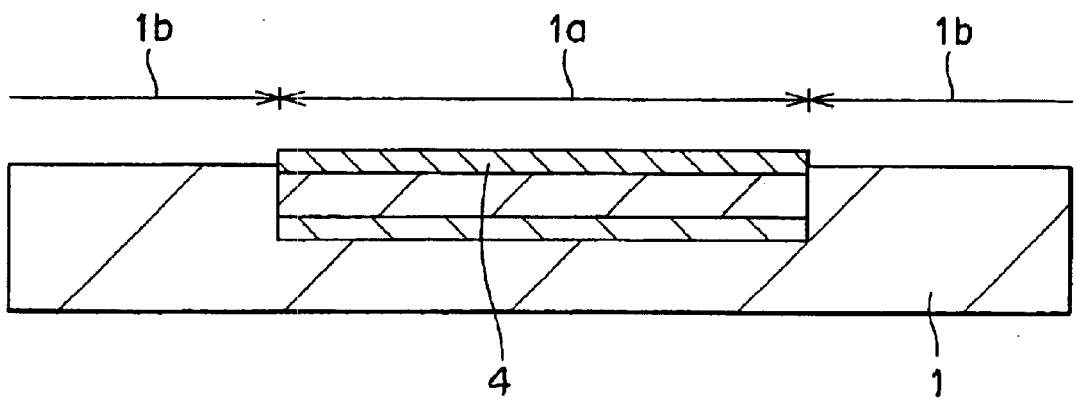

Referring to FIG. 3C, the sacrifice oxide film 5 is removed by wet etching using dilute hydrofluoric acid. After removal of the sacrifice oxide film 5, the surface of the silicon layer 4 in the n-type region 1a is about 50–100 nm higher than the surface of the silicon substrate 1 in the p-type region 1b.

Figure 4A:
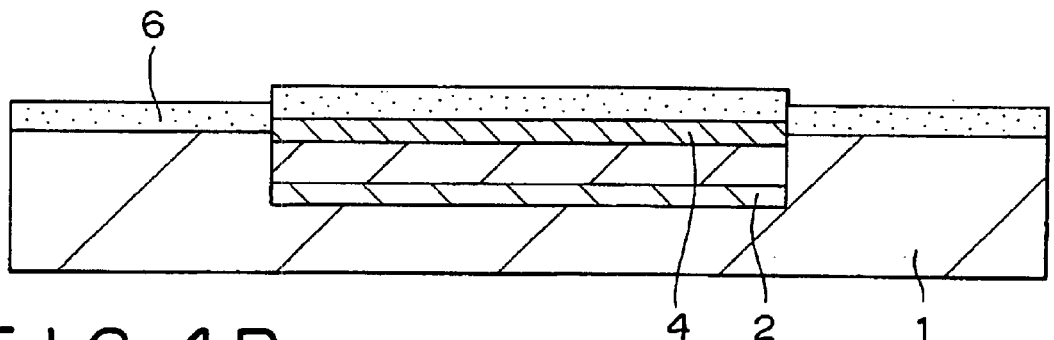
FIGS. 4A to 4D are views similar to FIGS. 2A to 2D showing the steps, continued from those shown in FIGS. 3A to 3C, of fabricating the semiconductor device.

Referring to FIG. 4A, a silicon-germanium compound ($Si_{1-z}Ge_z$) layer 6 having a thickness of about 100 nm is formed on both the silicon substrate 1 and the silicon layer 4. The composition ratio z of germanium in the silicon-germanium compound is set in a range of 0.1 to 0.8, preferably, at a value near 0.2. Like the formation of the buffer layer 2, the formation of the silicon-germanium compound layer 6 is performed by alternately introducing the silane gas and germanium gas at time intervals of a value ranging from several hundreds msec to several sec. The silicon-germanium compound layer 6 formed on the silicon substrate 1 functions as a layer having a strain effect due to compressive stress generated in the layer.

Figure 4B:
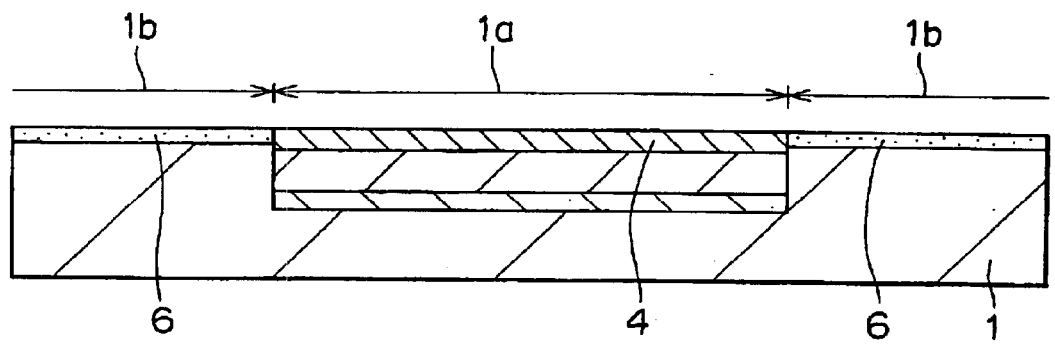

Referring to FIG. 4B, the surface of the silicon-germanium compound layer 6 is planarized by the CMP process, to expose the silicon layer 4 in the n-type region 1a while leaving the silicon-germanium compound layer 6 in the p-type region 1b. With this planarization, the thickness of the silicon layer 4 in the n-type region 1a becomes about 20 nm, and the thickness of the silicon-germanium compound layer 6 in the p-type region 1b becomes about 10 nm.

Figure 4C:
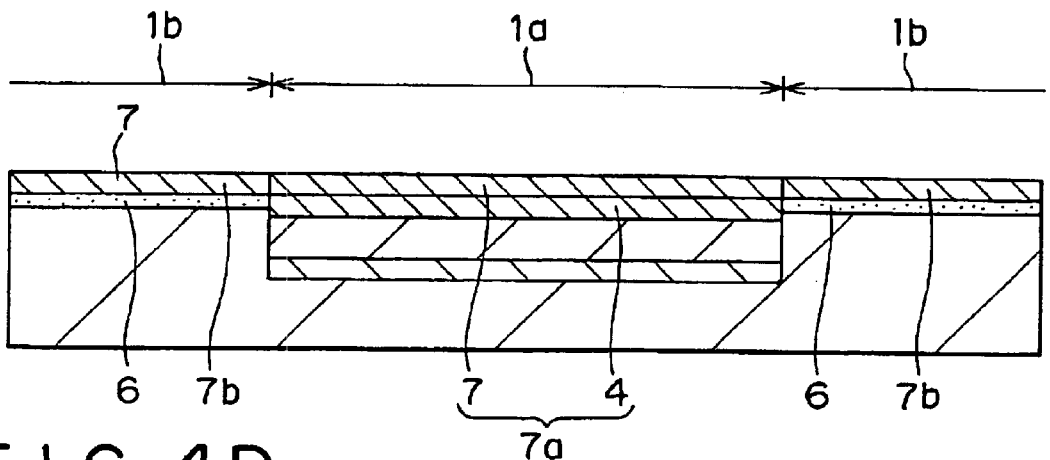

Referring to FIG. 4C, a silicon epitaxial layer 7 having a thickness of about 100 nm is formed on both the silicon layer 4 and the silicon-germanium compound layer 6, whereby a silicon layer 7a composed of the silicon epitaxial layer 7 and the silicon layer 4 is formed in the n-type region 1a, and the silicon epitaxial layer 7 becomes a cap layer 7b in the p-type region 1b. In the case of formation of a gate insulating film at the subsequent step, the cap layer 7b functions to improve the quality of the gate insulating film.

Figure 4D:
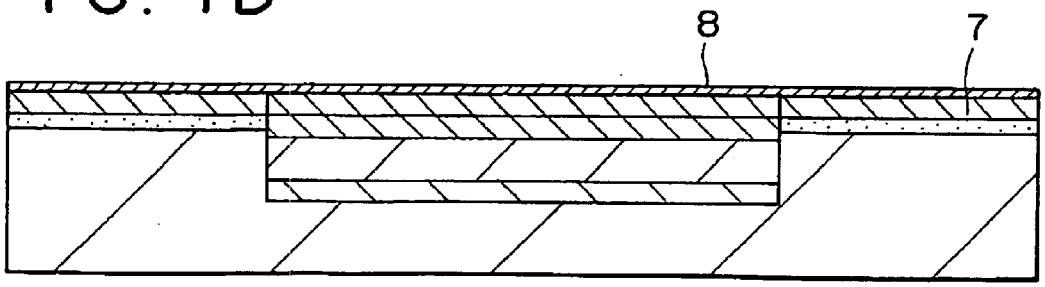

Referring to FIG. 4D, a sacrifice oxide film 8 is formed on the silicon epitaxial layer 7. The sacrifice oxide film 8 is formed in the same manner as that for formation of the sacrifice oxide film 5 (see FIG. 3A).

Figure 5A:
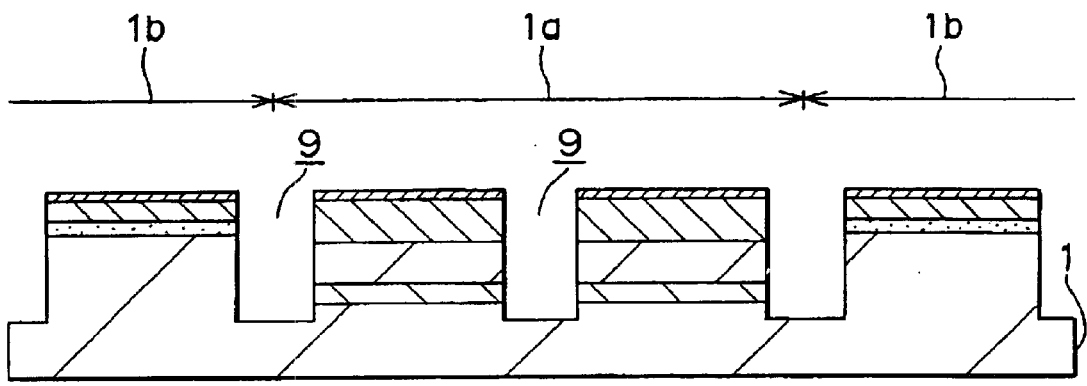
FIGS. 5A to 5C are views similar to FIGS. 2A to 2D showing the steps, continued from those shown in FIGS. 4A to 4D, of fabricating the semiconductor device.

Referring to FIG. 5A, a trench 9 is formed in an isolation region on the surface side of the silicon substrate 1 in the following procedure. A resist pattern (not shown) having an opening portion corresponding to the isolation region and a mask portion corresponding to device formation areas of the n-type region 1a and p-type region 1b is set over the silicon substrate 1. The resist pattern is formed by a lithography process using KrF excimer laser light as exposure light. The trench 9 having a depth of about 2.8 $\mu$m is formed in the isolation region by etching using the resist pattern as a mask. The resist pattern is removed after the formation of the trench 9.

If the n-type region 1a and p-type region 1b are provided at positions adjacent to each other, the width of the isolation region is set at such a value that the isolation region partially contains a stepped portion of the silicon substrate 1 in order to prevent occurrence of leakage current.

Figure 5B:
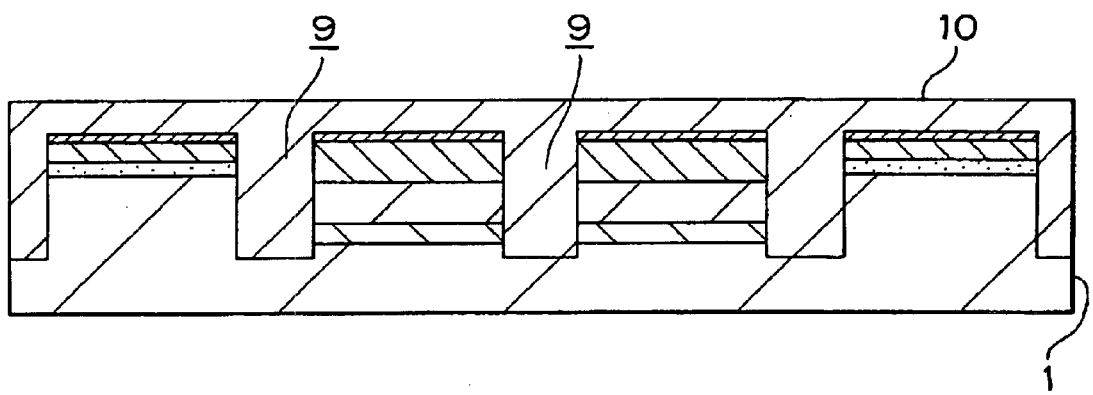
Figure 5C:
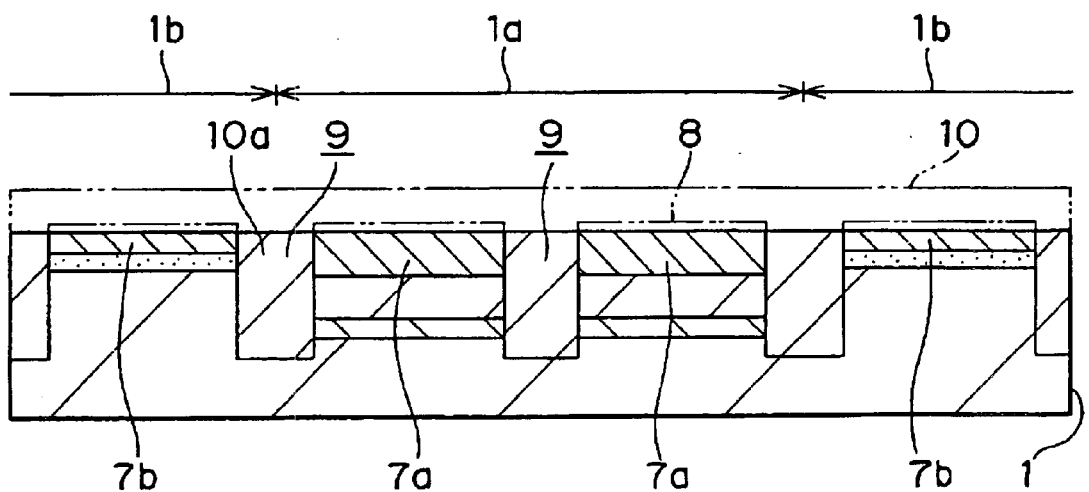

Referring to FIG. 5B, a silicon oxide film 10 is formed on the silicon substrate 1 in such a manner as to bury the trench 9 by a high density plasma CVD process. After that, referring to FIG. 5C, the silicon oxide film 10 and the sacrifice oxide film are subjected to CMP process, to expose the silicon layer 7a in the n-type region 1a and also expose the cap layer 7b in the p-type region 1b while leaving the silicon oxide film 10 only in the trench 9, whereby a shallow trench isolation (STI) 10a formed by the silicon oxide film 10 buried in the trench 9 is formed.

Figure 6A:
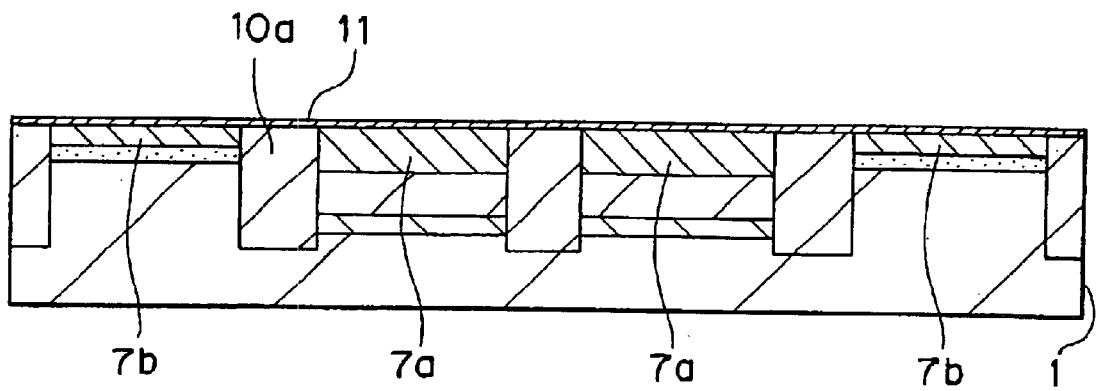
FIGS. 6A to 6C are views similar to FIGS. 2A to 2D showing the steps, continued from those shown in FIGS. 5A to 5C, of fabricating the semiconductor device.

Referring to FIG. 6A, silicon oxide is grown on the surface portions of the silicon layer 7a and the cap layer 7b to a thickness of about 5 nm by the thermal oxidation process, to form a gate oxide film 11. The oxidation temperature used for the formation of the gate oxide film 11 is set at a value equal to that used for the formation of the sacrifice oxide film 5.

Figure 6B:
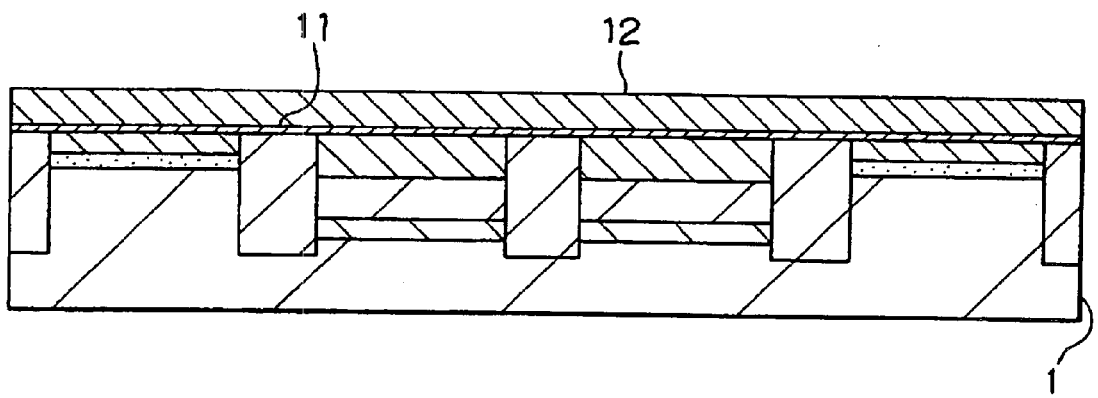

Referring to FIG. 6B, a polysilicon film 12 having a thickness of about 250 nm is formed on the gate oxide film 11 by a sputtering process.

Figure 6C:
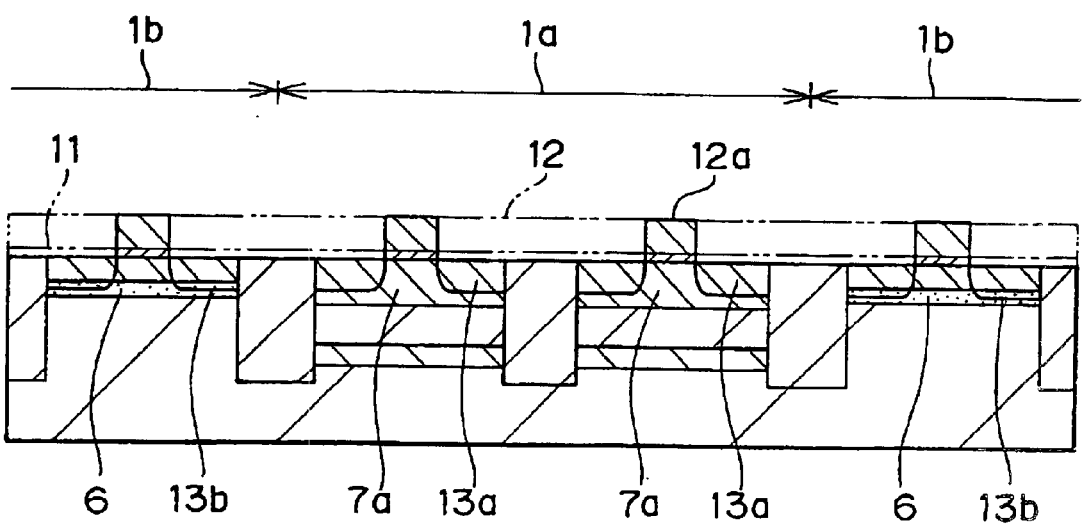

Referring to FIG. 6C, the polysilicon film 12 and the gate oxide film 11 are etched by using a resist pattern (not shown) formed by the lithography process as a mask, to form gate electrodes 12a made from the polysilicon film 12 on the silicon layer 7a in the n-type region 1a and the cap layer 7b in the p-type region 1b via the gate oxide film 11.

After a resist-pattern covering the p-type region 1b is set, ions of an n-type impurity are implanted in the silicon layer 7a in the n-type region 1a by using the gate electrode 12a as a mask, to form source/drain regions 13a in the silicon layer 7a. Similarly, after a resist-pattern covering the n-type region 1a is set, ions of a p-type impurity are implanted in the silicon-germanium compound layer 6 in the p-type region 1b by using the gate electrode 12a as a mask, to form source/drains regions 13b in the silicon-germanium compound layer 6. The resist pattern is removed after ion implantation.

Subsequently, side walls 14 made from an insulating film are formed on side walls of each of the gate electrodes 12a and gate oxide film portions 11.

In this way, a semiconductor device, in which the nMOSTr 15a is provided in the n-type region 1a of the silicon substrate 1 and the pMOSTr 15b is provided in the p-type region 1b of the same silicon substrate 1 is obtained. In the nMOSTr 15a of the semiconductor device thus formed, the source/drain region 13a are formed in the silicon layer 7a formed on the silicon substrate 1 via the buffer layer 2 made from the silicon-germanium compound and the relax layer 3 made from the silicon-germanium compound layer, and in the pMOSTr 15b of the semiconductor device, the source/drain regions 13b are formed in the silicon-germanium compound layer 6 formed on the silicon substrate 1.

In the nMOSTr 15a, since the silicon layer 7a is provided on the relax layer 3 made from the silicon-germanium compound whose stress is relaxed because it is formed on the buffer layer 2, tensile stress is generated in the silicon layer 7a, so that the mobility of electrons is increased by the strain effect due to tensile stress in the silicon layer 7a. As a result, the operational speed of the nMOSTr 15a in which the source/drains regions 13a are formed in the silicon layer 7a is improved.

On the other hand, in the pMOSTr 15b, since the silicon-germanium compound layer 6 is provided on the silicon substrate 1, compressive stress is generated in the silicon-germanium compound layer 6, so that the mobility of positive holes is increased due to the strain effect due to the compressive stress in the silicon-germanium compound layer 6. As a result, the operational speed of the pMOSTr 15b in which the source/drain regions 13b are formed in the silicon-germanium compound layer 6 is improved.

Another advantage of the semiconductor device is that since the semiconductor device has a CMOS configuration that the nMOSTr 15a and the pMOSTr 15b are provided on the common base-substrate, the power consumption thereof can be reduced. The semiconductor device has a further advantage that since the operational speed of each of the nMOSTr 15a and pMOSTr 15b is improved, the operational speed of a logic circuit can be made as high as several times to several tens times as compared with the related art CMOS in which the base-substrate is configured as only the silicon substrate.

According to this embodiment, since a portion in which crystal defects are easy to occur, that is, a boundary portion between the n-type region 1a and the p-type region 1b is removed at the trench isolation 10a formation step described with respect to the FIGS. 4A and 4B, it is possible to obtain a desired transistor performance.

Since the planar structure of the semiconductor device in this embodiment is similar to the related art CMOS in which the base-substrate is configured as only the silicon substrate, the circuit dimension of the semiconductor device in this embodiment is similar to that of the related art CMOS, the circuit design of the related art CMOS can be used for the semiconductor device in this embodiment as it is.

Since the above-described steps are carried out by using the technique generally used for fabricating the related art CMOS in which the base-substrate is configured as only the silicon substrate, it is possible to fabricate the semiconductor device in this embodiment without reduction of the productivity.

What is claimed is:

1. A method of fabricating a semiconductor device in which an n-channel field effect transistor and a p-channel field effect transistor are provided on a common base-substrate, said method comprising the steps of:

etching a surface layer of an n-channel region, in which said n-channel field effect transistor is to be formed, of a silicon substrate, to form a stepped recess at said n-type region;

forming a buffer layer made from a silicon-germanium compound having a germanium concentration gradually increased toward an upper surface of said buffer layer on said silicon substrate;

forming a relax layer made from a silicon-germanium compound having a germanium concentration nearly equal to that of a surface portion of said buffer layer on said buffer layer;

forming a silicon layer on said relax layer;

removing said silicon layer, said relax layer, and said buffer layer in a p-type region, on which a p-channel field effect transistor is to be formed, of said silicon substrate, by etching using a resist pattern as a mask;

forming a silicon-germanium compound layer on both said silicon substrate and said silicon layer;

planarizing the surface of said silicon-germanium compound layer in a state that said silicon layer is exposed in said n-type region and said silicon-germanium compound layer is left in said p-type region;

forming a silicon epitaxial layer on both said silicon layer and said silicon-germanium compound layer, to form a silicon layer composed of said silicon layer and said silicon epitaxial layer in said n-type region, and to form a cap layer composed of said silicon epitaxial layer in said p-type region; and forming gate electrodes on said silicon layer in said n-type region and on said cap layer in said p-type region via a gate insulating film, and forming n-type source/drain regions in said silicon layer and p-type source/drain regions in said silicon-germanium compound layer.

* * * * *